United States Patent [19]

Lemmer

[11] 4,215,610
[45] Aug. 5, 1980

[54] APPARATUS FOR PERFORATING A FOIL

[76] Inventor: Alfred Lemmer, Machtlfingerstrasse 24, D-8000 Munich 70, Fed. Rep. of Germany

[21] Appl. No.: 896,615

[22] Filed: Apr. 14, 1978

[30] Foreign Application Priority Data

Apr. 19, 1977 [DE] Fed. Rep. of Germany ....... 2717317

[51] Int. Cl.² .......................... B26D 7/02; H05K 3/06
[52] U.S. Cl. .......................................... 83/565; 408/3
[58] Field of Search ...................... 83/399, 565; 408/3

[56] References Cited

U.S. PATENT DOCUMENTS

| 2,701,017 | 2/1955 | Wiedeman | 83/552 X |
| 2,918,835 | 12/1959 | Watson et al. | 408/3 X |
| 3,169,434 | 2/1965 | Westerfield | 83/565 X |
| 3,377,887 | 4/1968 | Nelson et al. | 83/552 X |
| 3,546,978 | 12/1970 | Keown | 83/565 X |
| 3,738,764 | 6/1973 | Gribble | 408/3 |
| 3,874,262 | 4/1975 | Cailloux | 83/565 X |

Primary Examiner—J. M. Meister
Attorney, Agent, or Firm—Fitzpatrick, Cella, Harper & Scinto

[57] ABSTRACT

A foil perforating apparatus of the type wherein perforation locations on a large master pattern are transferred via a reduced motion system, such as a pantograph, to corresponding locations on a transparency foil to be punched. A foil punching device is carried on the reduced motion system. Accuracy of punching is achieved by a clamping means on the reduced motion system which is electrically interlocked with the foil punch to achieve clamping prior to punching.

12 Claims, 3 Drawing Figures

APPARATUS FOR PERFORATING A FOIL

BACKGROUND OF THE INVENTION

1. Field of the Invention

This invention relates to foil perforating apparatus of the type which includes a foil holder and a foil perforating means which are movable relative to each other. Such foil perforating apparatus are used to produce an image carrier for a component-mounting pattern adapted to be projected onto a printed wiring board to which components are to be attached.

2. Description of the Prior Art

From German patent application DT-AS 24 59 480.7, it is known to use, as an image carrier for a component-mounting pattern to be projected onto a printed wiring board to which components are to be attached, a foil of an opaque material provided with perforations representing component-insertion symbols. That German application states that an apparatus constructed in the manner outlined above may be used for perforating the foil.

It has been found that with prior-art apparatus of this type there is some uncertainty with regard to the accuracy of perforation since a shift, though slight, may occur between the foil holder and the perforating means during the perforation operation. Now when the foil is subsequently used as an image carrier in a projector, even slight shifts will result in fairly large deviations of the projected image on the printed wiring board to which components are to be attached.

SUMMARY OF THE INVENTION

The present invention overcomes the above described disadvantages of the prior art and provides a foil perforating apparatus characterized by greater accuracy than was heretofor attainable.

In its broader aspects the present invention involves the provision of fixing means for immobilizing the perforating means relative to the foil holder at least during the perforation operation.

A more specific and preferred form of the invention involves the provision of delaying means whereby the perforating operation may be delayed relative to the start of immobilization. This ensures that the perforating means and the foil holder are already immobilized relative to each other when the perforating operation starts.

When apparatus of the present invention is provided with movable sensing means for sensing a component-mounting master pattern having component-insertion symbols, movable perforating means, reducing means connecting the perforating means and the sensing means, and a rigidly disposed foil holder, all for example, as described in the aforesaid German application, the invention may be carried out by connecting the fixing means to the sensing means, to the reducing means or to the perforating means.

It is also known from the aforesaid German application to construct the reducing means of the apparatus as a pantograph articulated to a holding means. In such case the fixing means may be formed by a disk fastened to one bar of the pantograph. A clamping electromagnet is also attached to the bar and is disposed opposite the disk, and is separated from it by a gap. A fixing plate is fastened to the holding means and extends through the gap and the clamping electromagnet is adapted to be moved toward or away from the disk.

When embodied in such an apparatus the present invention may include arrangements by which the disk is made adjustable with respect to its normal spacing from the fixing plate.

Particularly good immobilization is assured when the fixing plate and/or the disk and/or the clamping electromagnet has or have a roughened or milled surface.

From the aforesaid German application, it is further known that the perforating means may be formed by a punch secured to the pantograph. When embodied in this apparatus the present invention may include the provision, in the fixing plate, of a cutout through which the punch extends, the cutout being dimensioned so that the range of movement of the punch is limited to the portion of the foil lying within one edge of the foil. This feature has special inventive significance. As described in said German application, the edge of the foil normally is beaded to give it stiffness. If the punch were to be guided directly above the surface of the foil, or, if its play were not limited and it were to be inadvertently run with greater or less force against the edge, it would damage the beaded edge of the foil and render the foil unfit for use as a transparency. This is prevented according to the present invention by limiting the range of movement of the punch.

The punch is advantageously actuated by an electromagnet which may be energized by the same switch as the clamping electromagnet. To secure the aforementioned delay, an electric delay network may be interposed between the switch and the electromagnet for the punch.

BRIEF DESCRIPTION OF THE DRAWINGS

An embodiment of the invention is described below with reference to the drawing, where.

DETAILED DESCRIPTION OF THE PREFERRED EMBODIMENT

Figure 1:
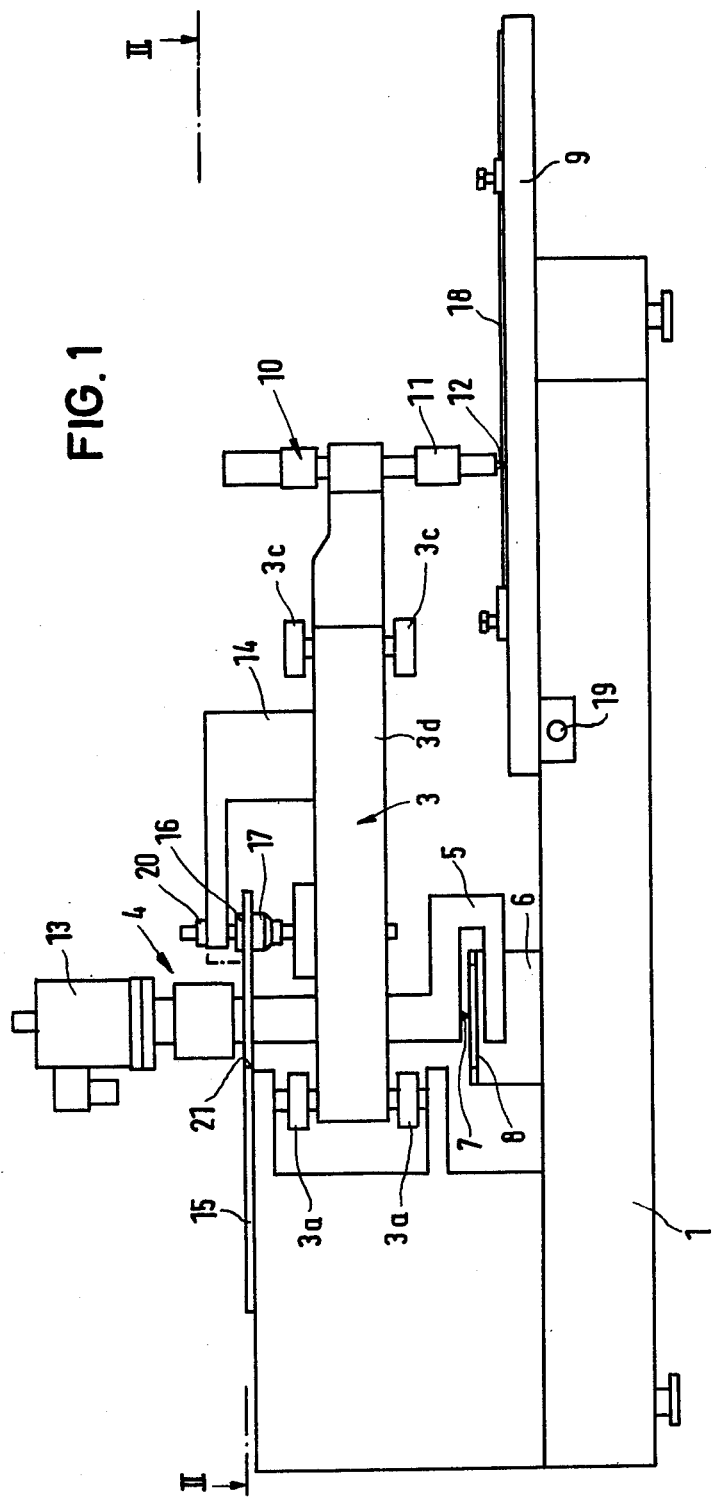
FIG. 1 is a side elevation of a foil perforating apparatus embodying the present invention.
Figure 2:
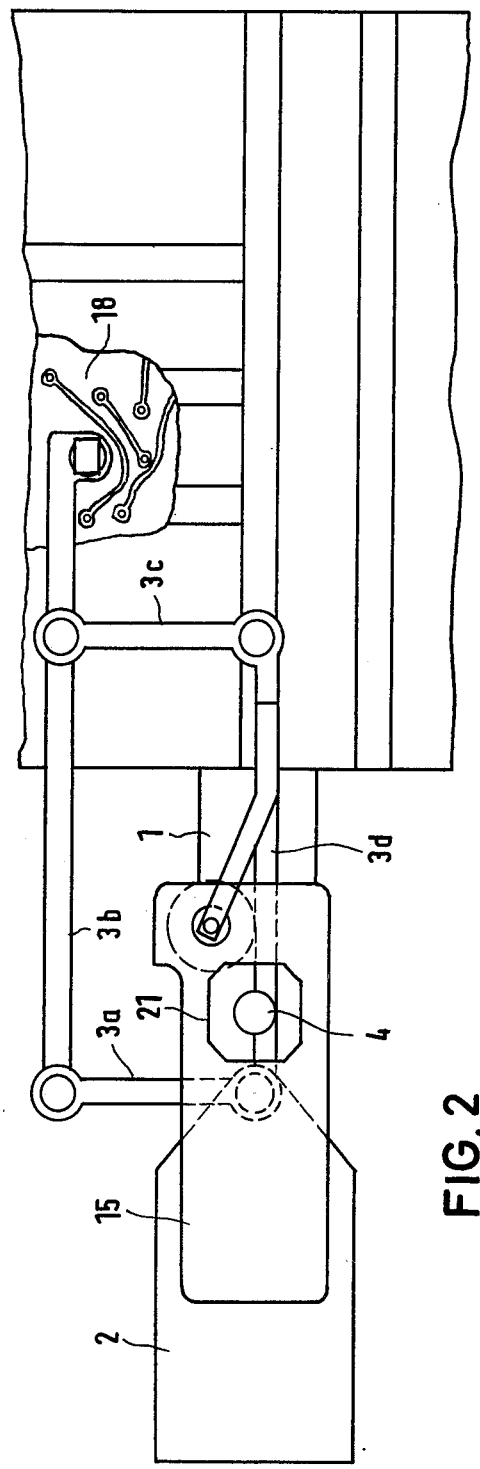
FIG. 2 is a sectional view taken along the line II—II in FIG. 1.

The foil perforating apparatus of FIGS. 1 and 2 comprises a base 1 on which a holding means 2 is mounted. Articulated to the holding means 2 is a pantograph 3. The pantograph has four bars 3a, 3b, 3c and 3d which are linked to form a parallelogram.

Fastened to one bar of the pantograph 3 is a punch 4 which has a punching pin 7 which, upon energization of an electromagnet 13, is thrust forward downwardly. Disposed at the lower end of the punch 4 is a clawlike part 5 whose lower leg is provided with an abutment for the punching pin 7. The clawlike part 5 is pushed over a foil holder 6 on which a transparency foil 8 is placed into which holes are to be punched.

The perforated transparency foil is to be placed in a projector with which selected holes of a printed wiring board to which components are to be attached is to be illuminated.

Disposed on the base 1 is a holder 9 for a component-mounting master pattern 18. The latter may comprise a printed wiring board already provided with holes.

On the appropriate bar of the pantograph 3 there is a sensing means 10. The latter incorporates a pin 12 which, by actuation of a grip 11, may be lowered and inserted in a hole, for example, of the printed wiring board 18 which serves as a master pattern for component mounting. Coupled to the grip 11 is a switch 23 (see FIG. 3) which, when operated, closes the circuit for the electromagnet 13. When the pin 12 is lowered by actuation of the grip 11, a corresponding punching operation is initiated.

Now when the component-mounting master pattern 18 (of which only a fragment is indicated in FIG. 2) is not a perforated printed wiring board, but is a drawing, for example, or when the transparency foil 8 is to be punched at a point where no hole is provided in the printed wiring board 18 (in order to punch a polarity sign, for example, into the transparency foil 8 for the insertion of diodes), then the pin 12 cannot be lowered. In this case a punching operation cannot be initiated at the punch 4 even when the grip 11 is actuated. For this reason, a pushbutton switch 19 is disposed on the base 1 whereby the electromagnet 13 can also be energized and a punching operation can thus be initiated.

Now when the pin 12 does not drop into a hole in the component-mounting master pattern 18, there is the danger that vibrations may cause the point of the pin 12 to slip before performing the punching operation, which is undesirable in view of the high precision required, errors being magnified in projection, and for this reason a fixing means for the pantograph 3 is provided on the transparency punching device. To this end, a fixing plate 15 is secured to the holding means 2. Disposed on a bar of the pantograph 3 is an L-shaped crossbar 14 carrying a disk 16 adapted to be raised or lowered by means of a nut 20. The disk 16 is arranged directly above the top surface of the fixing plate 15.

Disposed on said bar of the pantograph 3 below the fixing plate 15 is a clamping electromagnet 17 which when energized pulls up against the fixing plate 15 and pulls the latter toward the disk 16. The fixing plate is roughened or milled on its two outer surfaces to prevent slippage between the disk 16 and the magnet 17 on the one hand and the fixing plate 15 on the other hand when the clamping electromagnet pulls up. Thus the pantograph is immobilized.

Figure 3:
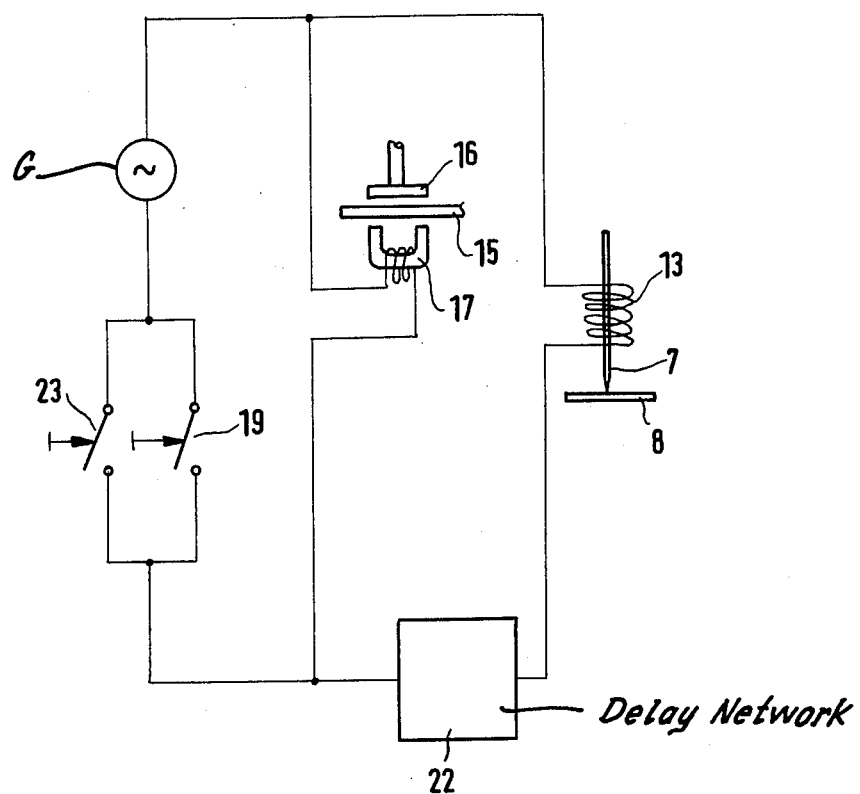
FIG. 3 is a circuit diagram of an electric circuit for energization of electromagnets used in the apparatus of FIG. 1.

An electrical circuit for the controlling apparatus of FIGS. 1 and 2 is shown in FIG. 3. This circuit includes the switch 19 as well as a switch 23 which is adapted to be operated by means of the grip 11. These switches are connected in parallel with each other and they each connect the clamping electromagnet 17 to an electrical power supply G. The switches 19 and 23 are also arranged each to connect the punching pin electromagnet 13 via a delay circuit 22 to the power supply G. When one of the switches 19 and 23 is closed, the clamping electromagnet 17 is energized first, and then, after the delay introduced by the delay network 22, the punching pin electromagnet 13 is energized. This assures that the pantograph 3 and hence the punch 4 are immobilized before the punching operation is initiated.

In the fixing plate 15 there is, moreover, a cutout 21 which limits the scope of motion of the punch 4 which can be effected by the pantograph 3. This limitation is maintained so that punching pin 7 and the abutment on the lower leg of the hooklike part 5 can move only within the window range of the transparency foil 8, which has been beaded at the edge for greater stiffness. If the pin 7 were to move beyond that point, it might damage the edge portion of the transparency foil.

What is claimed and desired to be secured by Letters Patent is:

1. Apparatus for perforating a foil for the purpose of producing an image carrier for a component-mounting pattern adapted to be projected onto a printed wiring board to which components are to be attached, said apparatus comprising a foil holder, a perforating device which may be operated for perforating foil held by said foil holder, means mounting said foil holder and perforating device to move relative to each other, fixing means for immobilizing movement of the perforating device relative to the foil holder at least during operation of said perforating device and means for delaying operation of said perforating device until said fixing means has immobilized movement of said perforating device.

2. Apparatus as defined in claim 1, including a movable sensing device for sensing a component-mounting master pattern provided with component-insertion symbols, and a movable motion reducing device connecting the perforating device and the sensing device, said fixing means being connected to one of said devices.

3. Apparatus as defined in claim 2 in which the motion reducing device comprises a pantograph articulated to a holding means, and wherein said fixing means comprises a disk fixed to a bar of the pantograph, a clamping electromagnet fixed to said bar and positioned opposite the disk with a gap between said disk and magnet, and a fixing plate secured to the holding means and extending through said gap, said clamping electromagnet being movable toward and away from the disk.

4. Apparatus as defined in claim 1 wherein said perforating device further includes a punch and a punch actuating electromagnet arranged to actuate said punch, wherein said fixing means is an electrically operated clamping device and wherein said apparatus includes circuit means including a switch connected to energize said punch actuating electromagnet and said clamping device and wherein said circuit means includes an electric delay network interposed between the switch and said punch actuating electromagnet.

5. Apparatus as defined in claim 4, including a movable sensing device for sensing a component-mounting master pattern provided with component-insertion symbols, and a movable motion reducing device connecting the perforating device and the sensing device, said fixing means being connected to one of said devices.

6. Apparatus for perforating a foil for the purpose of producing an image carrier for a component-mounting pattern adapted to be projected onto a printed wiring board to which components are to be attached, said apparatus comprising a foil holder, a perforating device which may be operated for perforating foil held by said foil holder, means mounting said foil holder and perforating device to move relative to each other, a movable sensing device for sensing a component-mounting master pattern provided with component-insertion symbols, a movable motion reducing pantograph connecting the perforating device and the sensing device and articulated to a holding means, a disk fixed to a bar of the pantograph, a clamping electromagnet fixed to said bar and positioned opposite the disk with a gap between said disk and magnet, and a fixing plate secured to the holding means and extending through said gap, said clamping electromagnet being movable toward and away from the disk.

7. Apparatus as defined in claim 6, wherein said disk is adjustable with respect to its spacing from the fixing plate.

8. Apparatus as defined in claim 3, wherein said disk is adjustable with respect to its spacing from the fixing plate.

9. Apparatus as defined in claim 6, wherein at least one of said fixing plate, said disk and said clamping electromagnet has a roughened surface.

10. Apparatus as defined in claim 3 wherein at least one of said fixing plate, said disk and said clamping electromagnet has a roughened surface.

11. Apparatus as defined in claim 6, 3, 7, 8, 9 or 10 wherein the perforating device includes a punch secured to the pantograph, and wherein said fixing plate is formed with a cutout through which the punch extends, said cutout being dimensioned so that the scope of motion of the punch is limited to the portion of the foil lying within an edge.

12. Apparatus as defined in claim 11 wherein said perforating device further includes a punch actuating electromagnet arranged to actuate said punch, and circuit means including a switch connected to energize said punch actuating electromagnet and said clamping electromagnet and further including an electric delay network interposed between the switch and said punch actuating electromagnet.

* * * * *